United States Patent [19]

Eden

[11] 4,075,576
[45] Feb. 21, 1978

[54] SENSITIVE HIGH SPEED SOLID STATE PREAMP

[75] Inventor: Richard C. Eden, Thousand Oaks, Calif.

[73] Assignee: Rockwell International Corporation, El Segundo, Calif.

[21] Appl. No.: 772,173

[22] Filed: Feb. 25, 1977

[51] Int. Cl.² .............................................. H03F 3/16
[52] U.S. Cl. .................................. 330/277; 330/291; 330/296; 330/311
[58] Field of Search ................. 330/59, 277, 291, 296, 330/311; 307/311

[56] References Cited

U.S. PATENT DOCUMENTS

| | | | |
|---|---|---|---|
| 3,271,685 | 9/1966 | Husher et al. | 330/28 X |
| 3,482,167 | 12/1969 | Kaplan et al. | 330/35 X |
| 3,927,383 | 12/1975 | Fjarlie et al. | 330/59 |

Primary Examiner—Lawrence J. Dahl
Attorney, Agent, or Firm—L. Lee Humphries; Craig O. Malin

[57] ABSTRACT

A preamp for coupling to an avalanche photodiode (APD) of an optical receiver has an input stage including a dual gate field effect transistor (FET) and a single gate FET coupled in a cascade arrangement. The dual gate FET has its first gate coupled to the output of the APD, its second gate and source grounded, and its drain driving the gate of the single gate FET in a cascade arrangement. The source of the single gate FET is level-shifted and coupled by means of a feedback resistor to the first gate of the dual gate FET to provide a negative feedback. The output stage is a third FET with its gate coupled through a blocking capacitor to the source of the single gate FET in the input stage and with its drain providing the output of the preamp. In a preferred embodiment, the FETs used are GaAs FETs (GAAS-FETs).

13 Claims, 6 Drawing Figures

SENSITIVE HIGH SPEED SOLID STATE PREAMP

The invention was made in the performance of work under an air force contract

BACKGROUND OF THE INVENTION

A. Field of the Invention

This invention relates to the field of electronics and more particularly to the field of solid state preamps for optical receivers.

B. Description of the Prior Art

The efficient use of laser communications, particularly for satellites, requires the development of a very sensitive and very high speed (gigabit data rate) optical receiver which is compact and lightweight. Prior receivers of high sensitivity and speed were not completely solid state and, hence, were bulky and not acceptable for use in satellites. Until the present invention, no reliable, completely solid state receiver could approach the sensitivity and speed required for efficient laser communications.

SUMMARY OF THE INVENTION

It is an object of the invention to provide a preamp having high sensitivity for use with a high speed avalanche photodiode.

It is a further object of the invention to provide a preamp having a very wide signal bandwidth for use with a high speed avalanche photodiode.

It is an object of this invention to provide an all solid state preamp having high sensitivity and a very wide signal bandwidth.

It is an additional object of the invention to provide a solid state receiver for use in laser communications.

According to the invention, the preamp of an optical receiver has an input stage including a dual gate field effect transistor (FET) and a single gate FET coupled in a cascade arrangement (preferably GaAs FETs). The dual gate FET has its first gate coupled to the output of the ADP, its second gate and source grounded, and its drain driving the gate of the single gate FET in a cascade arrangement. The source of the single gate FET is level-shifted and coupled by means of a feedback resistor to the first gate of the dual gate FET to provide a negative feedback. The output stage is a third FET with its gate coupled through a blocking capacitor to the source of the single gate FET in the input stage and with its drain providing the output of the preamp.

These and other objects and features of the present invention will be apparent from the following detailed description, taken with reference to the accompanying drawings.

DESCRIPTION OF THE PREFERRED EMBODIMENT

Figure 1:
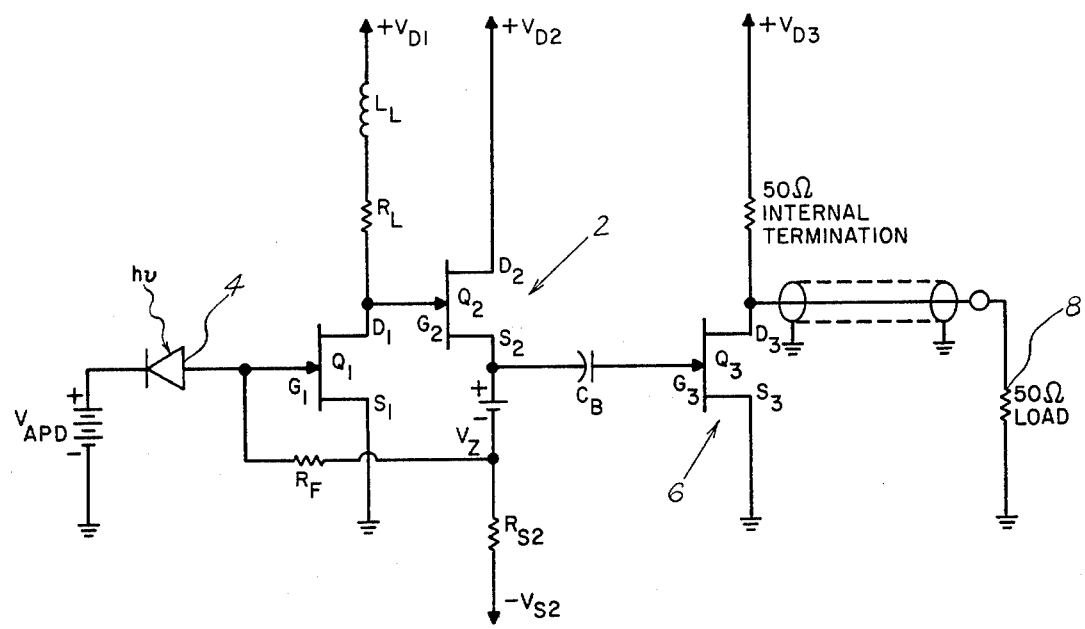
FIG. 1 is a simplified circuit diagram of the preamp of the invention coupled to an avalanche photodiode (APD) at its input.

Two fundamental limitations to the sensitivity of a preamp for detecting photocurrent pulses exist: (1) The voltage noise-input capacitance limit; and (2) the Johnson or thermal noise current in the load or feedback resistance. If a photodiode with junction capacitance $C_J$ is connected to a preamp with input capacitance $C_{IN}$, then a charge pulse $Q_P$ from the photodiode will produce a voltage change $\Delta V \leqq Q_P/(C_J + C_{IN})$ (where the $\leqq$ is used since there may, in general, be other shunt conductances). If the preamp has a total rms input voltage noise $e_n$, then the minimum detectable charge pulse (amount of charge required to make $\Delta V = e_n$) will be $Q_{MI} \geqq e_n(C_J + C_{IN})$, or in terms of the number of electrons, $$N_o \geqq e_n(C_J + C_{IN})/q \qquad (1)$$

where $N_o$ is the "minimum detectable current pulse" or number of electrons in a current impulse required to make the voltage change equal the rms noise ($q = 1.602 \times 10^{-19}$ coul).

As shown by Equation 1, to attain high pulse sensitivity in a preamp for a receiver (that is, low $N_o$) the preamp must have a low input voltage noise combined with a total input capacitance (preamp plus photodiode) that is extremely small. In practice, the input voltage noises for wideband amplifying devices of high quality are not widely different, so that the principal way to reduce $N_o$ is to reduce the capacitance ($C_J + C_{IN}$). This means that the detector with which the preamp is used should have a low junction capacitance $C_J$ and negligible series resistance. This capacitance advantage can be maintained by utilizing field effect transistors (FETs) which also have low input capacitance, such as GaAs FETs (GAAS-FETs). As discussed later, other FETs can be utilized; however, they will result in different performance levels for the preamp depending upon their electrical characteristics.

To improve the preamp sensitivity (reduce $N_o$), the Johnson noise current in the load resistor, $i_{nj} = \sqrt{4KT\Delta F/R}$ must be reduced. The increase in R allowed, for the same bandwidth, by reducing ($C_J + C_{IN}$) helps, but is insufficient to achieve the two order of magnitude increase in R required to achieve a one order of magnitude reduction in $I_{nj}$. In a feedback mode, or transimpedance-type of amplifier with open-loop gain A, the 3db bandwidth is given by $f_{3db} = A/2\pi R_F(C_J + C_{IN})$, as compared with $f_{3db} = \frac{1}{2}\pi R_L(C_J + C_{IN})$ for a simple load resistor configuration. Hence, by going to a feedback mode FET preamp with A = 10 having an order of magnitude lower ($C_J + C_{IN}$) than a simple bipolar transistor preamp, R can be increased by two orders of magnitude and $i_{nj}$ and $N_o$ reduced by at least an order of magnitude.

For gigabit and higher data rate applications or very short pulse detection, it is essential that the operational amplifier stage ("op-amp" stage) of the preamp have wide, closed-loop bandwidth and large values of feedback resistance $R_F$. Detailed analysis of experimental single FET "op-amp" stage preamps leading to the present invention indicated that the principal problem was that the loading capacitance, $C_L$, on the FET was too large and limited the high frequency performance. This problem with the experimental designs stems from the fact that the single FET does not represent a true operational amplifier because it does not have low output impedance. Hence, the loading effect of $C_L$ degrades the "op-amp" gain bandwidth.

In the preamp of the present invention, the input stage 2 is a two FET ($Q_1$, $Q_2$) true operational amplifier with low output impedance, as shown in the simplified circuit diagram, FIG. 1. The gate $G_1$, of the first FET $Q_1$, is coupled to the preamp input which is shown as avalanche photodiode 4. Light, hv, striking the APD creates the signal for the preamp. The source $S_1$ of the first FET is grounded and the drain $D_1$ is connected in parallel to a positive voltage $+V_{D_1}$ and to the gate $G_2$ of a second FET $Q_2$. The level shifted $V_z$ output from source $S_2$ is fed back through feedback resistance $R_F$ to the input $G_1$ of the first FET $Q_1$. The drain $D_2$ is connected to a positive voltage $+V_{D_2}$.

Figure 1A:
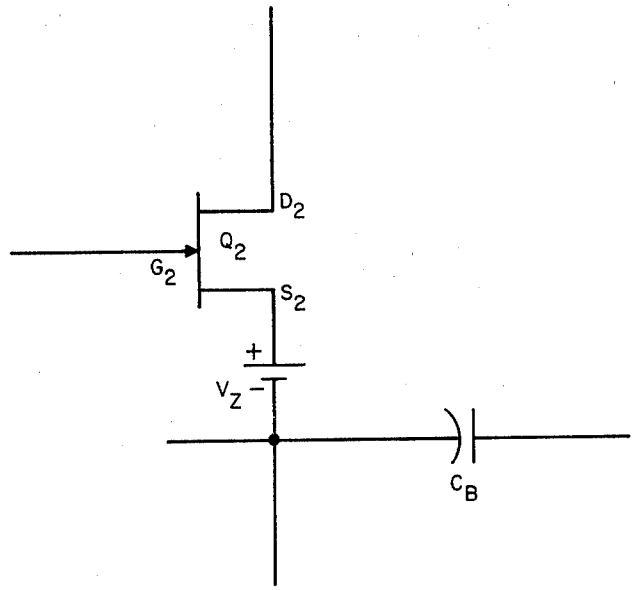
FIG. 1a shows a modification of the circuit shown in FIG. 1.

The output stage 6 comprises a third FET $Q_3$ with a grounded source $S_3$ and a gate $G_3$, coupled to the source $S_2$ of the second FET through a blocking capacitor $C_B$. While in FIGS. 1 and 2 $C_B$ is shown connected to the top (positive side) of $V_z$, connecting $C_B$ to the bottom (negative side) of $V_z$ is actually preferable in that low frequency noise on the zener is reduced by feedback in the latter configuration, as shown in FIG. 1a. The drain $D_3$ of the output stage FET is connected in parallel to a positive voltge $+V_{D_3}$ through an internal load termination and to the output load 8 of the preamp through a transmission line.

Figure 2:
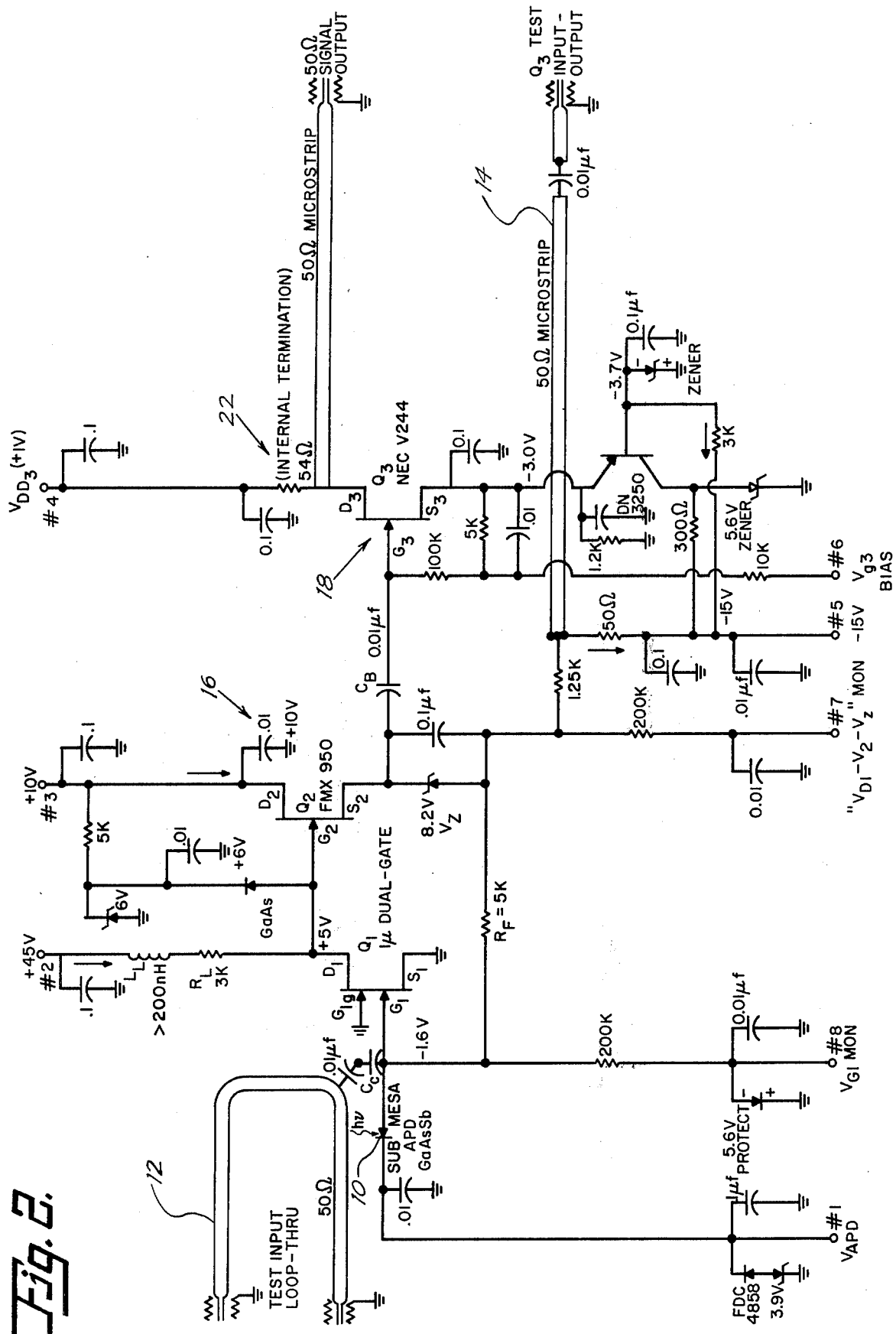
FIG. 2 is a circuit diagram of a preferred embodiment of the preamp coupled to an APD at its input and also showing test input and test output circuitry.

FIG. 2 is a circuit diagram of a preferred embodiment of the preamp coupled to an APD 10 at its input and also including a test input loop 12 and a test input-out circuit 14. The electrical components in FIG. 2 performing similar functions as the components described in FIG. 1 are similarly identified.

The input stage 16 is an "op-amp" voltage gain stage in a cascade arrangement with a grounded source FET $Q_1$ driving a source follower FET $Q_2$. $Q_1$ is a dual-gate FET with its second gate $G_{1_g}$ grounded in order to obtain a high drain output resistance which is necessary to achieve high open-loop voltage gain. The use of a dual-gate FET $Q_1$ operated with the second gate $G_{1_g}$ grounded, is an operational equivalent of a cascode arrangement of two single gate FETs. From a functional standpoint, the input stage 16, with dual-gate FET as $Q_1$, is effectively a three-FET cascode-cascade amplifier (grounded source-grounded gate-grounded drain).

The output from $Q_2$ is level-shifted by level-shifter zener diode $V_z$ and is the output feedback to the input, gate $G_1$, through feedback resistor $R_F$. Because of this closed-loop negative feedback mode of operation of this $Q_1$-$Q_2$ "op-amp," stability can only be guaranteed if the sum of the phase shifts in $Q_1$, $Q_2$ and the feedback resistor ($R_F$) to input capacitance ($C_J + C_{IN}$) network is less than 180°, at any frequency for which the open-loop gain exceeds unity. The use of very wide gain-bandwidth product FETs for $Q_1$ and $Q_2$ such as GaAs FETs and careful control of the feedback capacitance in parallel with $R_F$ assure stable, high speed response.

It should be noted that operation of $Q_1$, which has a breakdown voltage of the order of $V_{DS} \sim 10$ volts from a 45-volt power supply, represents a dangerous condition in that if $V_{g1}$ becomes too negative, $V_{D2}$ will rise and $Q_1$ will breakdown, possibly destructively. In order to avoid this possible disaster, a diode is connected from the drain of $Q_1$ to a +5 volt zener-limited potential. This diode is normally reverse biased, but if $V_{D1}$ exceeds 5.5 volts or so, this diode will begin conducting and keep $V_{D1}$ from exceeding a safe $V_{DS} = 6$ volts. The diode used is a special ultra low capacitance (<0.05pf) beam-leaded GaAs Schottky barrier mixer diode. An alternate approach would be to put this drain voltage limiting diode on the source side of $Q_2$, assuming that it is safe to pass the full drain current of $Q_1$ ($I_{D2} \sim V_{D1}/R_L$) as a forward current through the gate of $Q_2$ without damaging $Q_2$.

The output stage 18, shown in FIG. 2, is a single gate FET $Q_3$ which is coupled by a blocking capacitor $C_B$ to the input stage 16 (again $C_B$ might better be coupled to the lower, negative side of $V_z$ than the upper side as shown). The drain $D_3$ of the FET $Q_3$ is directly coupled to the 50Ω output line, with the dc balance adjusted by a trimpot in the power supply controlling the dc bias on $G_3$. The output stage 18 of the preamp has its own internal termination 22 with its resistance selected so that the parallel combination of the resistance of the internal termination and the drain resistance of FET $Q_3$ is 50 ohms, the transmission line impedance. As a result, signal reflections from the following amplifiers will be absorbed in the internal termination and will not cause intersymbol interference in communications applications.

The purpose of the output stage 18 is to serve as a low capacitance buffer between the high impedance of the $Q_2$ drain and the 50Ω output impedance. To $Q_2$, $Q_3$ looks like a capacitive load (often referred to as $C_L$) and $C_L$ must be kept small in order that an acceptable bandwidth be maintained in the input stage 16. For this reason, a GaAs FET is used for $Q_3$ as well as for $Q_1$ and $Q_2$. In addition, the hybrid circuit layout is optimized for low stray capacitance.

Figure 3:
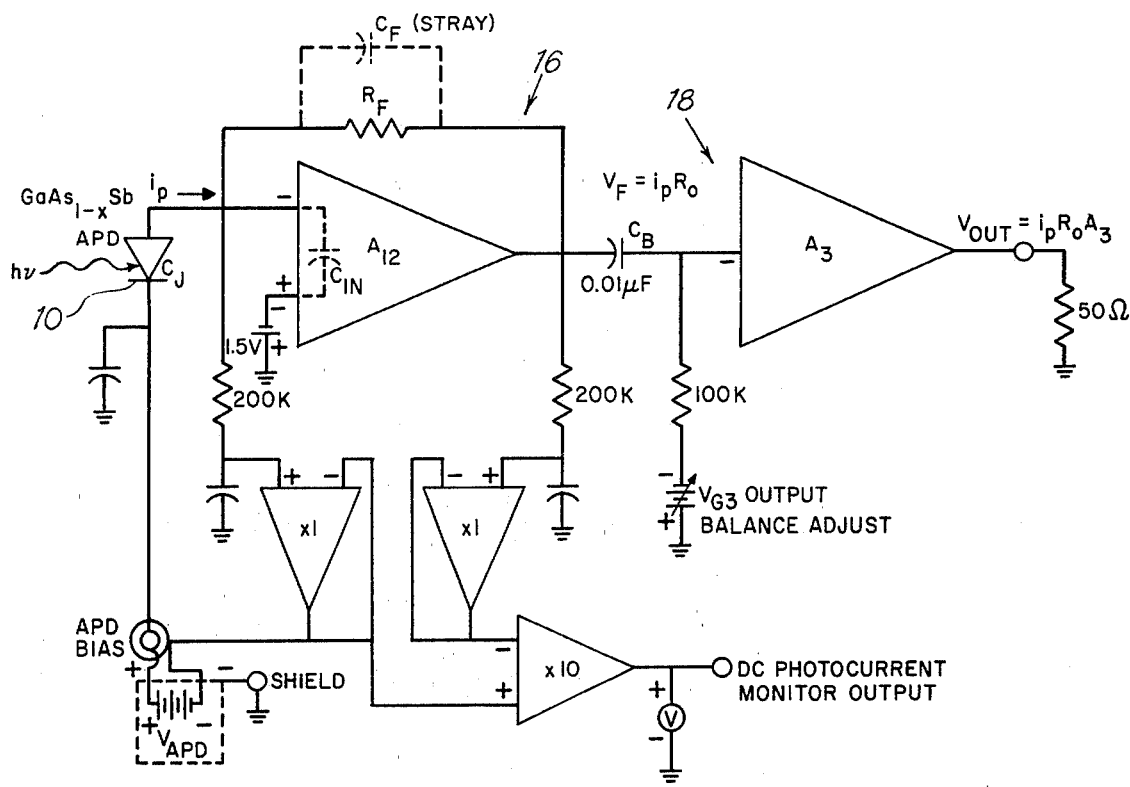
FIG. 3 is a functional block diagram of the preamp according to the embodiment of FIG. 2.

FIG. 3 is a functional block diagram of the preamp according to the embodiment shown in FIG. 2. The input stage 16 is coupled to an APD 10 and the output stage 18 is coupled to the input stage by coupling capacitor $C_B$.

Figure 4:
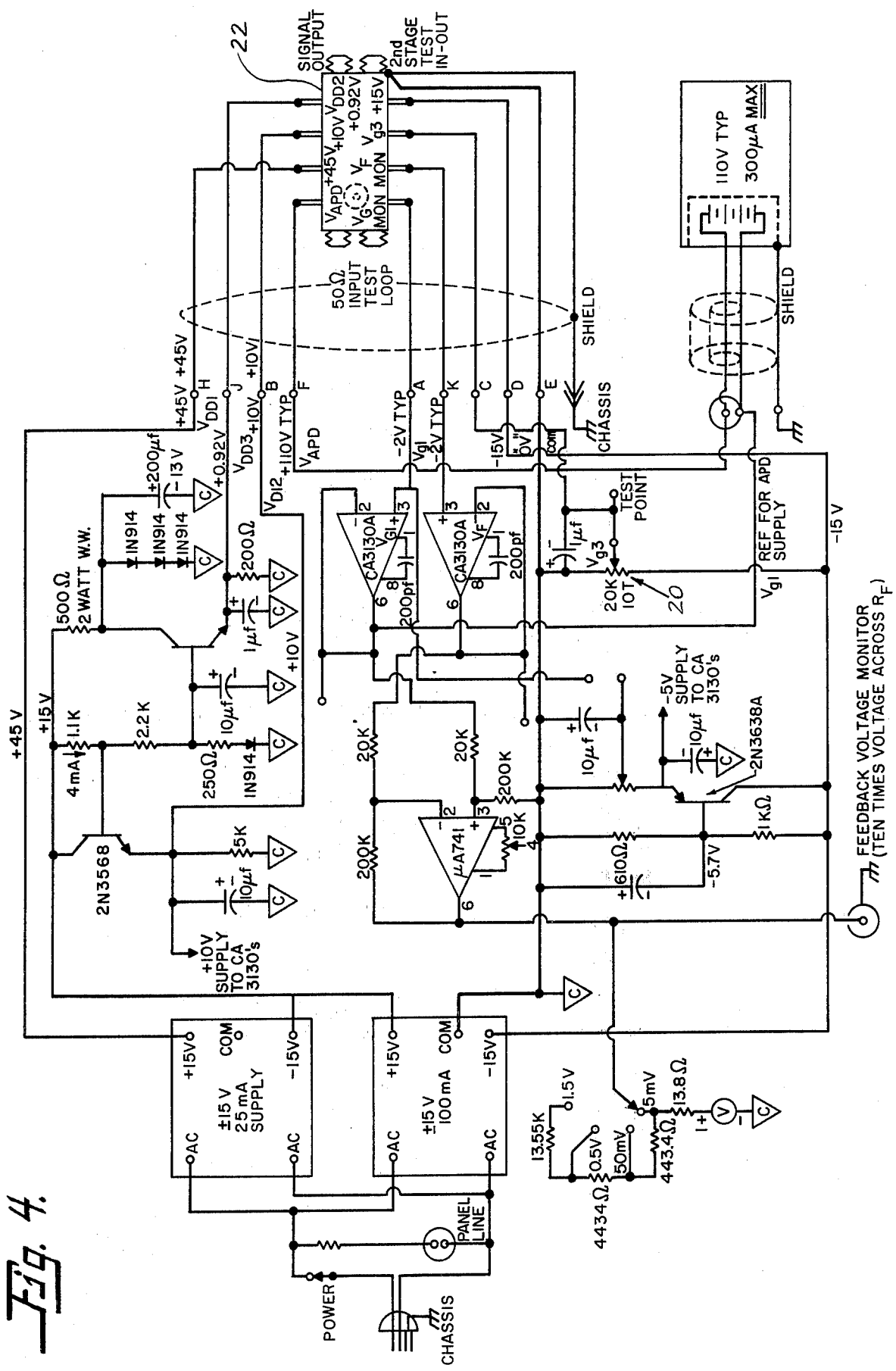
FIG. 4 is a circuit diagram for a power supply-monitor for the preamp used in an optical receiver.

FIG. 4 is a circuit diagram for a power supply monitor for the preamp when used in an optical receiver 22. Trimpot 20 is used to adjust the dc balance of the gate $G_3$ of FET $Q_3$ in the output stage 18 of the preamp shown in FIG. 2.

Figure 5:
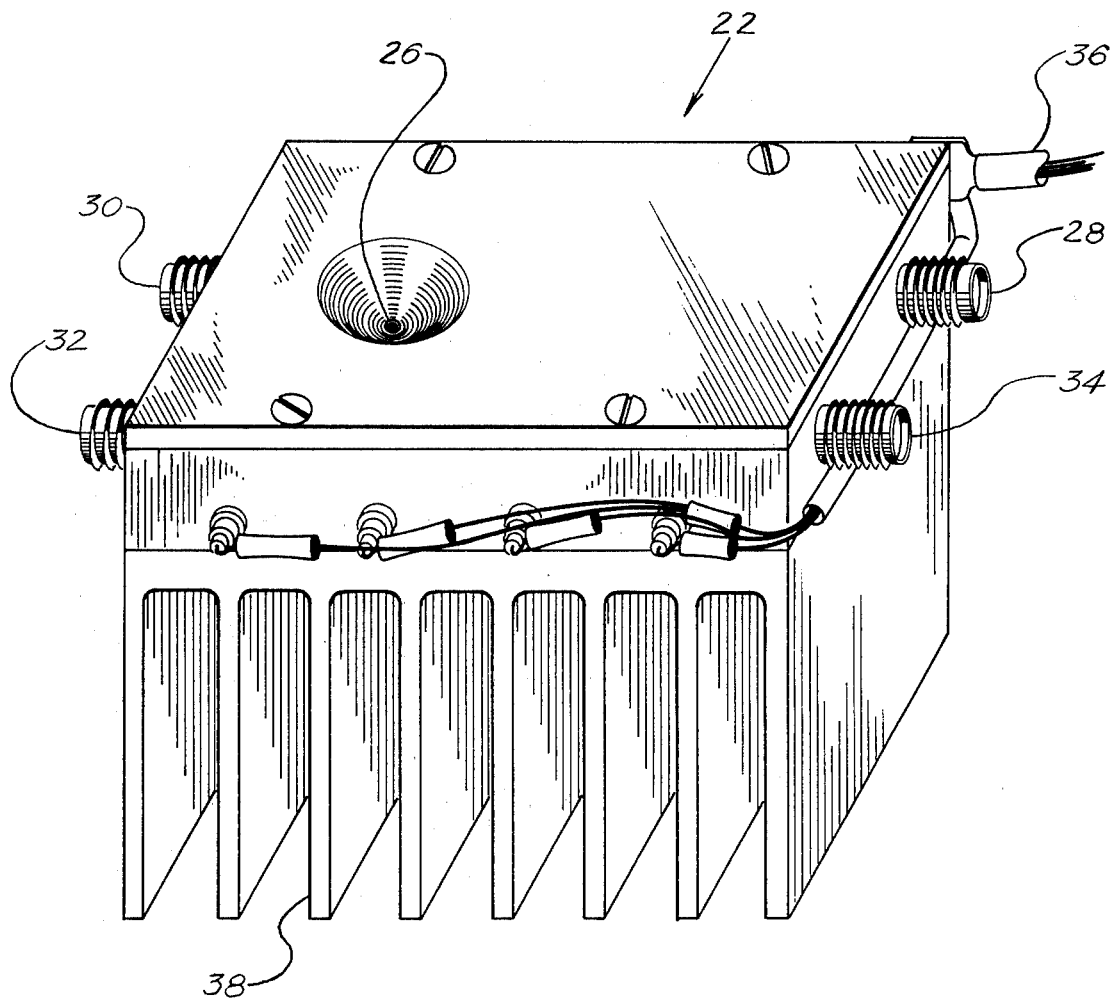
FIG. 5 is a perspective view of an optical receiver utilizing the preamp of the invention.

FIG. 5 is a perspective view of an optical receiver 22 utilizing the preamp of the invention. The receiver includes an opening 26 for light entrance to the APD, a signal output port 28, ports for test loops 30, 32, 34, and power supply leads 36. The fins 38 are used to help keep the temperature of the APD constant.

In a preferred first embodiment, the three FETs $Q_1$, $Q_2$, $Q_3$ are GaAs Schottky barrier FETs (GAASFETS) identified commercially and having electrical characteristics as given in Table 1 below.

TABLE I

| Stage | GAASFET Identity | Gate Type Size | Drain Resistance $R_D$ | Transconductance gm |
|---|---|---|---|---|
| $Q_1$ | Hitachi HCRL-94 | Dual 1μ | ~1700Ω | 11.1 mmhos at $I_D$ of 13 mA (gate 1) |
| $Q_2$ | Fairchild FMX 950 | Single 2μ | 600-800Ω | 12.1 mmhos at $I_D$ of 10.5 mA |

TABLE I-continued

| Stage | GAASFET Identity | Gate Type Size | Drain Resistance $R_D$ | Transconductance gm |
|---|---|---|---|---|
| $Q_3$ | Nippon Electric NEC V244 | Single 1µ | 250–400Ω | 13.2 mmhos at $I_D$ of 17 mA |

In a preferred second embodiment, a better GAASFET (an NEC V463) for stage $Q_1$ is used which has higher transconductance (18.1 mmhos at at $I_D$ of 13.3 mA bias current) and a higher drain resistance $R_D$ of 2200Ω. This gives a preamp with higher transimpedance and even lower noise, as shown in Table II below:

TABLE II
PREAMP CHARACTERISTICS

| Characteristic | First Embodiment | Second Embodiment |
|---|---|---|
| Open-loop "op-amp" gain | 10.8 | 19.5 |
| Open-loop $F_{3dB}$ (O.L.) | 275 MHz | 320 MHz |
| Open-loop gain-bandwidth | ~2.2–3 GHz | 5 GHz |
| Feedback Resistance, $R_f$ | 2500Ω | 5000Ω |
| Transimpedance, $R_o(V_f/i_p)$ | 2290Ω | 4750Ω |
| 3db bandwidth (closed-loop) $F_{3dB}$ | 596 MHz | 620 MHz |
| RMS output noise through cascaded B&H preamps, 3GH$_z$ B.W. | 12.81 mV rms 375 KHz to 3 GHz | 12.15 mV 375 KHz to 3 GHz |
| Minimum detectable current pulse (numbers of electrons to give peak output equal to rms noise output). | 782 electrons 375 KHz to 3 GHz | 347 electrons 375 KHz to 3 GHz |
| Input capacitance | .75 pf | .28 pf |

Other embodiments of the invention may utilize other types of FETs. For example, preamps can be constructed utilizing Schottky barrier gate type FETs, junction type FETs, and heterojunction gate type FETs. Such FETs can be made from GaAs, InP, and other suitable alloys from the Group III-V elements. Even silicon Schottky gate type FETs can be utilized, although preamp performance will be less than shown for preamps using GaAs FETs.

The low input capacitance of the preamp, together with its very high speed and extreme charge-sensitivity, make it ideal for use in laser communication at gigabit data rates utilizing an avalanche photodiode having a very low junction capacitance. Depending upon the wavelength used, the preamp is suitable for use with any avalanche photodiode having low junction capacitance. The preamp has been used with a special inverted homo-heterojunction $GaAs_{1-x}Sb_x$ avalanche photodiode sensitive to a 1.064µ light signal and having a junction capacitance $C_j$ of 0.1 pf and peak avalanche gains up to 24 dB at 273 MHz. However, the preamp is suitable for use with any avalanche photodiode or signal source having a low junction capacitance, preferably less than 0.2 pf.

Numerous variations and modifications may be made without departing from the present invention. Accordingly, it should be clearly understood that the form of the present invention described above and shown in the accompanying drawings is illustrative only and is not intended to limit the scope of the present invention.

What is claimed is:

1. A preamp comprising:
    an input stage including
        a first FET having a drain coupled to a positive voltage, a gate for coupling to the input of the preamp, and a grounded source;
        a second FET having a source, a gate coupled to said drain of said first FET, and a drain coupled to a positive voltage;
        a level shifting circuit; and
        a feedback resistance in series with said level-shifting circuit, said source of said second FET being coupled to said gate of said first FET through said level-shifting circuit and said feedback resistance to provide a negative feedback to said first FET; and
    an output stage coupled to said source of said second FET, and having a transmission line output which is lower in impedance than the output impedance of said second FET, said output stage serving as a low capacitance buffer between the low impedance of said transmission line output and the relatively higher output impedance of said second FET.

2. The preamp as claimed in claim 1, wherein said level-shifting circuit comprises a level-shifter zener diode coupled in series with said resistor between said source of said second FET and said gate of said first FET.

3. The preamp as claimed in claim 1, wherein said first and second FETs each comprise separate CaAs Schottky barrier-gate FETs.

4. The preamp as claimed in claim 1, wherein said first FET comprises a dual gate FET with its second gate grounded.

5. The preamp as claimed in claim 1, wherein said first FET comprises a dual gate GaAs Schottky barrier-gate FET with its second gate grounded; and said second field effect transistior comprises a single gate GaAs Schottky barrier-gate FET, wherein said input stage is effectively a three GaAs Schottky barrier-gate FET cascode-cascade amplifier.

6. A preamp comprising:
    a first input FET having a drain coupled to a positive voltage, a gate for coupling to the input of the preamp, and a grounded source,
    a second input FET having a source, a gate coupled to said drain of said first FET, and a drain coupled to a positive voltage;
    a level-shifting circuit;
    a feedback resistance in series with said level-shifting circuit
    a blocking capacitor, said source of said second input FET being coupled in parallel to said blocking capacitor and to said gate of said first input FET through said level-shifting circuit and said feedback resistance to provide a negative feedback to said first input FET; and
    an output FET having a gate coupled to said blocking capacitor, a grounded source, and a drain coupled in parallel to a positive voltage and to the output of the preamp.

7. The preamp as claimed in claim 6, wherein said blocking capacitor is coupled in parallel to said source of said second input FET on the positive side of said level-shifting circuit.

8. The preamp as claimed in claim 6, wherein said blocking capacitor is coupled in parallel to said source of said second input FET on the negative side of said level-shifting circuit.

9. The preamp as claimed in claim 6, wherein said first input FET comprises a dual gate input FET with its second gate grounded.

10. A preamp as claimed in claim 6, wherein said first FET comprises a dual gate GaAs Schottky barrier-gate FET with its second gate grounded; and said second FET comprises a single gate GaAs Schottky barrier-gate FET, wherein said input stage is effectively a three GaAs Schottky barrier-gate FET cascode-cascade amplifier.

11. The preamp as claimed in claim 10, wherein said input comprises an avalanche photodiode.

12. An optical receiver comprising:
an avalanche photodiode;
an input dual gate GaAs Schottky barrier-gate FET having a first gate coupled to the output of said avalanche photodiode, a second gate grounded, a source grounded, and a drain coupled to a positive voltage;
an input single gate GaAs Schottky barrier-gate FET having a source, a gate coupled to said drain of said dual gate FET, and a drain coupled to a positive voltage;
a level-shifting circuit;
a feedback resistance in series with said level-shifting circuit;
a blocking capacitor, said source of said single gate FET being coupled in parallel to said blocking capacitor and to said first gate of said dual gate FET through said level-shifting circuit and said feedback resistance to provide a negative feedback to said dual gate FET; and
an output single gate GaAs Schottky barrier-gate FET having a gate coupled to said blocking capacitor, a grounded source, and drain coupled in parallel to a positive voltage and to the output of the preamp.

13. The optical receiver as claimed in claim 12, wherein said avalanche photodiode comprises an inverted homo-heterojunction $GaAs_{1-x}Sb_x$ avalanche photodiode.

* * * * *